(12) United States Patent
Chen et al.

(10) Patent No.: US 7,081,645 B2
(45) Date of Patent: Jul. 25, 2006

(54) SMD(SURFACE MOUNT DEVICE)-TYPE LIGHT EMITTING DIODE WITH HIGH HEAT DISSIPATION EFFICIENCY AND HIGH POWER

(75) Inventors: Yen Cheng Chen, Pan Chiao (TW); Ching Lin Tseng, Pan Chiao (TW); Sher Chain Wei, Pan Chiao (TW); Ming Li Chang, Pan Chiao (TW)

(73) Assignee: Bright Led Electronics Corp., Taipei (TW)

( * ) Notice: Subject to any disclaimer, the term of this patent is extended or adjusted under 35 U.S.C. 154(b) by 0 days.

(21) Appl. No.: 11/078,344

(22) Filed: Mar. 14, 2005

(65) Prior Publication Data

US 2006/0076570 A1    Apr. 13, 2006

(30) Foreign Application Priority Data

Oct. 8, 2004    (TW) .............................. 93216029 U

(51) Int. Cl.
  *H01L 29/22*    (2006.01)
(52) U.S. Cl. ................... 257/99; 257/706; 257/711; 257/E33.057; 257/E33.058; 257/E33.075
(58) Field of Classification Search ............... 257/98, 257/99, 100, 706, 707, 676, 711, E33.057, 257/E33.058, E33.075; 362/365, 373, 800
See application file for complete search history.

(56) References Cited

U.S. PATENT DOCUMENTS

| | | | |
|---|---|---|---|
| 6,900,511 B1* | 5/2005 | Ruhnau et al. | 257/432 |
| 2002/0163006 A1* | 11/2002 | Yoganandan et al. | 257/81 |
| 2004/0217369 A1* | 11/2004 | Nitta et al. | 257/99 |
| 2004/0264195 A1* | 12/2004 | Chang et al. | 362/294 |
| 2005/0077616 A1* | 4/2005 | Ng et al. | 257/707 |

* cited by examiner

*Primary Examiner*—Minhloan Tran
*Assistant Examiner*—Benjamin Tzu-Hung Liu
(74) *Attorney, Agent, or Firm*—Rosenberg, Klein & Lee

(57) ABSTRACT

A SMD-type LED with high heat dissipation efficiency and high power includes a base with a post arranged and integrated on the center thereof and a slot on top of the post. At least one contact hole is arranged on bottom of the base for connecting with an external heat sink so as to achieve better heat dissipation. The slot is used for accommodating a LED chip that is electrically connected with a circuitry extension device through two electrical contacts. The LED chip is electrically connected with the circuitry extension device directly while it also connects with the base for heat dissipation, thus the structure for electricity conduction is separated from the structure for heat dissipation.

9 Claims, 7 Drawing Sheets

SMD(SURFACE MOUNT DEVICE)-TYPE LIGHT EMITTING DIODE WITH HIGH HEAT DISSIPATION EFFICIENCY AND HIGH POWER

BACKGROUND OF THE INVENTION

The present invention relates to a SMD(surface mount device)-type LED (light emitting diode) with high heat dissipation efficiency and high power, especially to a light emitting diode with separate structures for electricity conduction and heat dissipation. While being assembled, an external circuitry and a heat sink are connected with a light emitting diode chip in different directions.

Light emitting diode (LED) is a fine solid-state light source made of semiconductor material. The device that turns electricity into light features on the compact structure, with long lifetime, low driving voltage, fast reaction, and good shock resistance. It can also be applied in various appliances with light weight and compact design and is quite popular in our daily lives.

According to wavelength, LED is divided into visible LED and invisible LED. As to visible LED, the general LED and high brightness LED are differentiated by the brightness—1 candle/sq.cm. The former is applied to indoor display systems while the later is suitable for outdoor display such as center high-mounted stop lamp, outdoor LED display and traffic signs. By development of the manufacturing techniques of LED chip, the luminous efficiency of LED is also improved and a larger size LED chip is available. In accordance with higher electricity, luminous flux of a single high power LED chip is decades of lumen, even hundreds of lumen. Therefore, it is believed that LED will replace incandescent lamp as a new generation of light source. People in industry or research institute in various countries are dedicated to developing high-luminous LED chip and the related lamp design.

However, by the increasing of the electric current, the heat produced by the LED chip also rises. Thus how to dissipate heat effectively becomes an important issue in the package and application of high power LED in order to ensure light emitting efficiency and reliability of LED.

For solving the over-heat problem of high power LED, it is obviously a trend to connect a LED chip with a leadframe with larger size than conventional one as well as a heat sink with good thermal conductivity. Refer to U.S. patent application publication No. 65,902,352, applied by one of the American leading companies that manufacture high power LED-Lumileds on Feb. 2, 2001, a high power LED is attached on top of a metal base with high thermal conductivity so as to dissipate high heat produced by a LED chip working under normal operating current (such as 350 mA) rapidly. Under the limitation of requirement for downsizing of LED components, the volume and surface of the metal base are restricted so that the capacity for heat dissipation is not enough. Thus the metal base should be connected with an external heat sink with larger size for enhancing heat dissipation. Thus the device can be used for a long time under normal operating current (such as 350 mA). However, the connection direction of circuitry and the connection between the metal base and the external heat sink are in the same direction. In order to avoid the short circuit between the positive and negative electrodes on circuitry, there is an insulating layer on up surface of the external heat sink for connecting with the positive and negative electrodes of LED. The insulating layer not only reduces the thermal conductivity of the heat sink, but also raises the difficulty of processing that the circuitry is connected by soldering while the connection of heat sink is by other welding techniques.

A high power LED with similar design is also disclosed in US patent application publication No. 2004/0075100A1, dated Oct. 10, 2003, applied by Georg Bogner et al. The connection direction between the metal base and the external heat sink is the same with the connection direction of circuitry with the metal base. Thus when being applied, the device also has the same problems of heat dissipation and assembling as mentioned above.

Refer to Taiwanese patent application publication No. 488557, dated Jun. 13, 2001, applied by Lite-On Technology Corporation, a LED with a low thermal resistance is disclosed. Refer to FIG. 1A, a LED packaging structure is composed of a low thermal resistance LED with a heat dissipation plate 10', a LED chip 12' over the dissipation plate 10', positive and negative electrodes of the LED chip 12' connected with a printed circuit board 13', and a protective cover 14'; a heat dissipation base 3' connected with the dissipation plate 10' of the LED with a low thermal resistance; a copper-clad laminates 2' joined with the printed circuit board 13' of the LED with a low thermal resistance. Therefore, the surface-to-air thermal resistance of the LED chip 12' is reduced and the efficiency of LED is enhanced.

The structure for electricity conduction includes the printed circuit board 13' connected with the copper-clad laminates 2' while the heat dissipation structure is through the heat dissipation plate 10' connected with the heat dissipation base 3'. Although the connection directions of structure for electricity conduction and the heat dissipation structure are different, the device still has the disadvantage that the heat dissipation plate 10' is not pressed on the heat dissipation base 3' firmly, the connection therebetween is not tight so that the heat dissipation efficiency has been affected. In another embodiment, shown in FIG. 1B, the upper and lower pieces of printed circuit boards are fastened by screws so that the heat dissipation plate is not connected with the heat dissipation base firmly. But the upper printed circuit board with low rigidity is easy to get deformed. Thus once the two side of the printed circuit boards are fastened by screws, it must have warp and this lead to the breakage or damage of the tiny gold wire connecting between the positive and negative electrodes of LED chip and the printed circuit board. The diameter of the gold wire is generally 0.03 mm. Therefore, the reliability of the LED has been affected badly.

Thus there is a need to provide a novel SMD-type LED with separate structure for electricity conduction and heat dissipation so as improve the above shortcomings of traditional SMD-type LED.

SUMMARY OF THE INVENTION

Therefore it is a primary object for the present invention to provide a SMD-type LED with high heat dissipation efficiency that is composed of a base made of high thermal conductive material, a post on the center of the base, and a slot for accommodating a LED chip arranged on top of the post. At least one contact hole is disposed on the bottom of the base. The contact hole is either a penetrating through hole or a blind hole with thread. By fasteners such as screws, the base is connected with an external heat sink firmly as well as thermal grease applied on the connecting surface. Therefore, a high efficiency of heat dissipation is achieved.

In order to achieve above object, the present invention provides a SMD-type LED composed by a base made of high thermal conductive material connected with an external circuitry extension device having a central hole thereof. At least one contact hole is disposed on the bottom of the base. The contact hole is either a penetrating through hole or a blind hole with thread for connecting the base with an external heat sink. The center of the base penetrates and integrates with the central hole of the circuitry extension device by heat resistant resin. Moreover, a post is disposed on the center of the base and integrated with the base while a slot for accommodating a LED chip arranged on top of the post. Through the positive/negative electrodes thereof, the LED chip is electrically connected with the circuitry extension device on top of the base, then through circuitry printed on flexible copper clad laminate or metal leadframe on the circuitry extension device further connecting with external circuit. Therefore, the LED chip is connected with the circuitry extension device directly for electrical connection and is connected with the base for dissipation so as to separate structure for electricity conduction from structure for heat dissipation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFFERED EMBODIMENT

The electricity and heat dissipation of conventional SMD-type LED are all through the same component. Or the mechanism of heat dissipation of the device is through a circuit board connected with a heat-dissipation component. There is not enough pressure between the base of LED and the external heat-dissipation plate so that the efficiency of heat dissipation is reduced. Thus the present invention provides a SMD-type LED with high heat dissipation efficiency in order to solve the above-mentioned disadvantages of prior art.

Figure 1A:
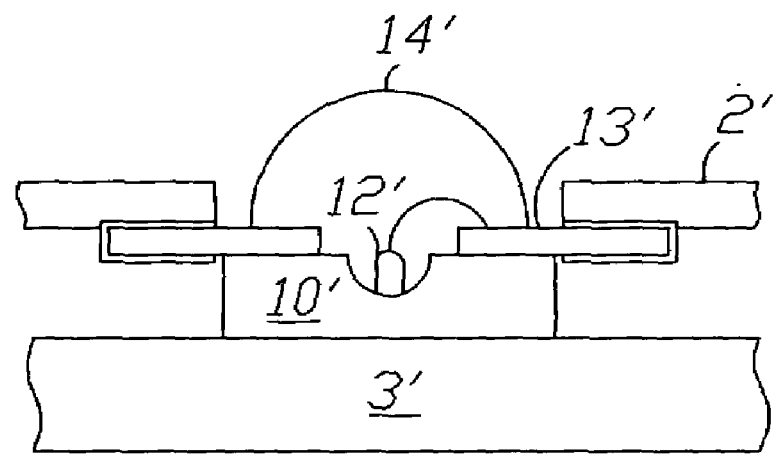
FIG. 1A is a schematic drawing of a SMD-type light emitting diode of a prior art.
Figure 1B:
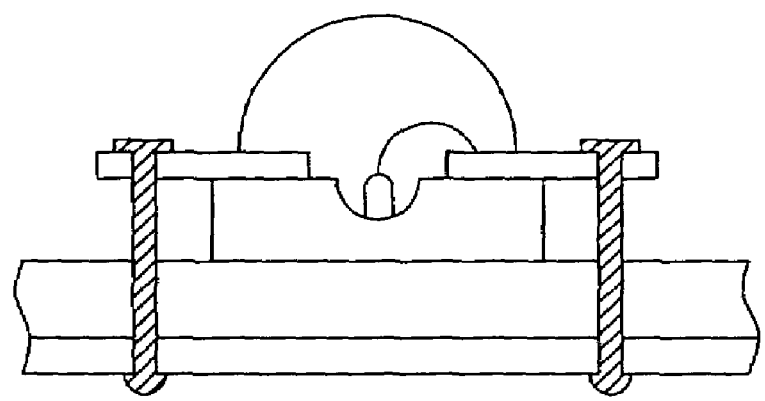
FIG. 1B is a schematic drawing of another SMD-type light emitting diode of a prior art.
Figure 2A:
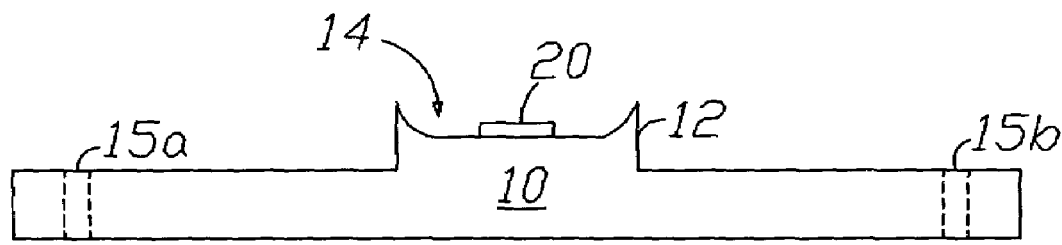
FIG. 2A & FIG. 2B are schematic drawing of a base of a better embodiment in accordance with the present invention.
Figure 2B:
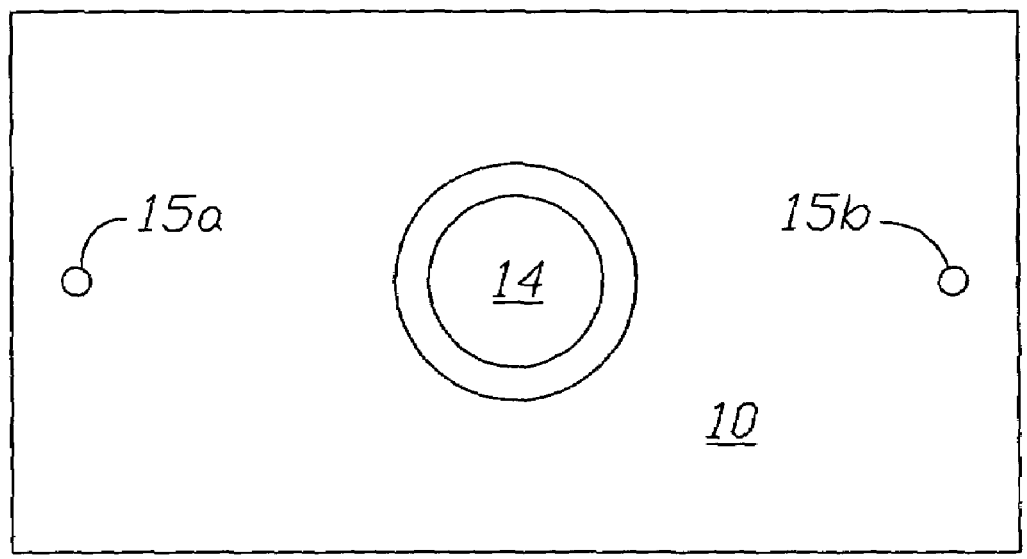
Figure 3:
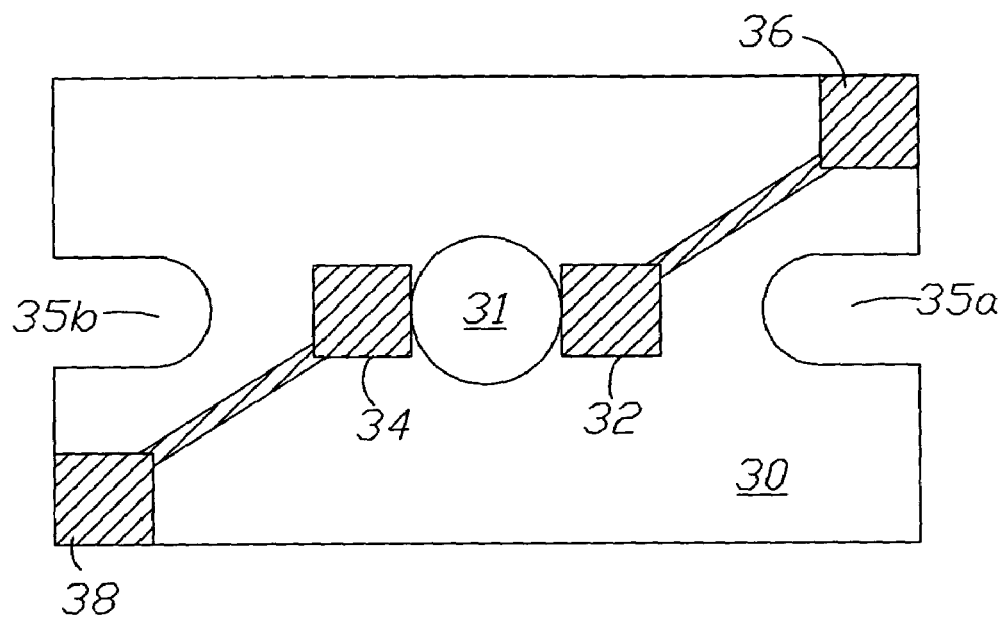
FIG. 3 is a top view of a circuitry extension device of a better embodiment in accordance with the present invention.
Figure 4:
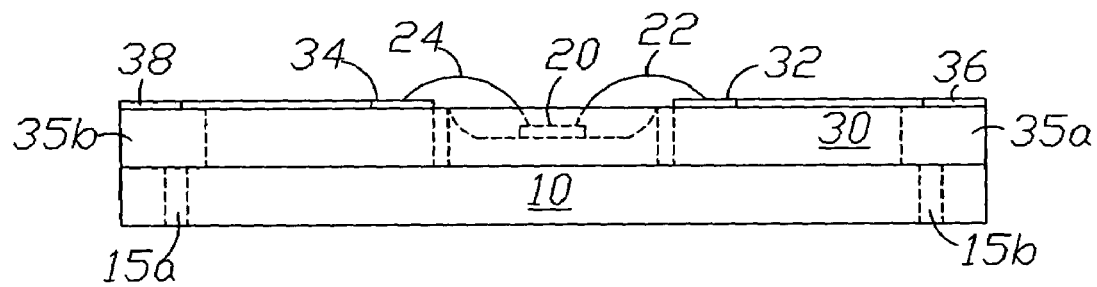
FIG. 4 is a schematic drawing showing a circuitry extension device assembled with a base in accordance with the present invention.

Refer from FIG. 2 to FIG. 5, schematic drawings showing the manufacturing process and structure of a better embodiment according to the present invention are disclosed. As shown in FIG. 2A (side view) and FIG. 2B (top view), a SMD-type LED in accordance with the present invention is composed of a base 10 that is made of high thermal conductive material such as gold, copper, aluminum, silver, graphite, related alloy or compounds. A post 12 with a slot 14 on top side thereof is disposed on the center of the base 10. The slot 14 is used to accommodate the LED chip 20. Penetrating contact holes 15a, 15b are arranged on two sides of the bottom of the base 10 respectively. Refer to FIG. 3, a circuitry extension device 30 is disclosed. The embodiment of the present invention takes a printed circuit board 30 (PCB) as an example. A central hole 31 is located on the center of the printed circuit board 30. Two electrical contacts 32, 34 for connecting with the positive and negative electrodes respectively of LED chip, and connecting pads 36, 38 for connecting external circuit are arranged on the surface of the printed circuit board 30. The electrical contacts 32, 34 are connected to the connecting pads 36, 38 by circuitry printed on flexible copper clad laminate. Slots 35a, 35b are arranged on two sides of the printed circuit board for accommodating lock screws of external heat sinks. Then the printed circuit board 30 is disposed on top of the base 10 so the post 12 on the center of the base 10 inserts through the central hole 31 on the printed circuit board 30, as shown in FIG. 4. The base 10 can be attached with the printed circuit board 30 by high-temperature resistant glue.

Figure 5:
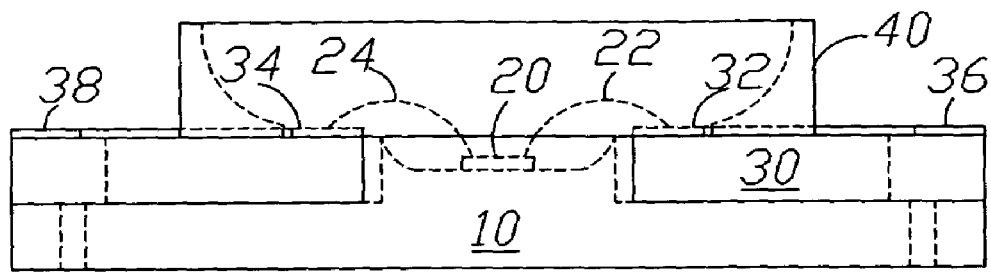
FIG. 5 is a schematic drawing showing a circuitry extension device assembled with a light-gathering shade in accordance with the present invention.

The printed circuit board 30 having two electrical contacts 32, 34 for electrical connection of the positive and negative electrodes (not shown in figure) of LED chip 20 through gold wire or aluminum wire bonding 22, 24. Refer to FIG. 5, a light-gathering shade 40 is covered on top of the printed circuit board 30 and epoxy resin and silicon rubber are filled therein in order to protect the LED chip 20 and gather light emitting from the LED chip 20.

Thus the circuitry extension device dominates electrical connection of the SMD-type LED 1 while the base 10 assists heat dissipation. Heat dissipation and electricity of the present invention has respective structures. The LED chip is electrically connected with the circuit board directly while the heat dissipation is through the base connected closely to the LED chip. Moreover, when the base of the present invention is connected to external heat sinks, screws are used to connect the base and the heat sink firmly so as to improve the efficiency of heat dissipation.

Figure 6:
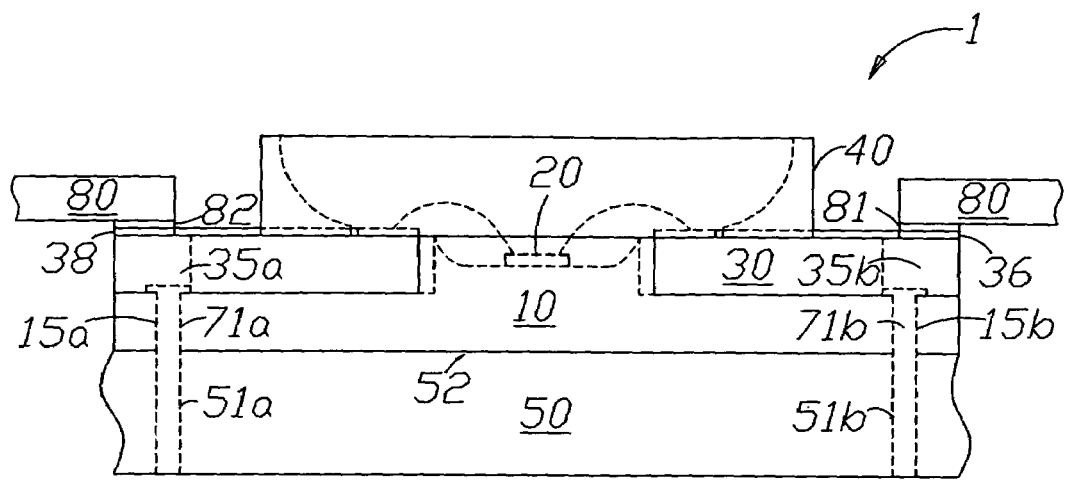
FIG. 6 is a schematic drawing of an embodiment of a SMD-type light emitting diode with high heat dissipation efficiency in accordance with the present invention.

Refer to FIG. 6, an embodiment of application showing the assembling of the base and external heat sink is disclosed. The embodiment of the present invention further having an external heat sink 50, screws 71a, 71b for connecting the base and the external heat sink 50, and an external circuit board 80. The external heat sink 50 having two screw holes 51a, 51b, corresponding to the penetrating contact holes 15a, 15b on two sides of the base 10 for fixing screws 71a, 71b. In order to increase the effective contact area between the heat sink 10 and the external heat sink 50, thermal grease (not shown in figure) is applied on the upper surface 52 of the external heat sink 50. By the fastening of screws 71a, 71b, the effect of heat conduction between the base 10 and the heat sink 50 is enhanced due to the fact that the thickness of the thermal grease is squeezed down to a very thin layer by the pressure applied by the fastened screws. As to electrical connection, the connecting pads 36, 38, on the circuitry extension device 30 are connected with connecting pads 81, 82 on an external circuitry 80 respectively by soldering. A through hole is processed on the external circuitry 80 in advance so as to avoid the light emitting from the LED.

Figure 9:
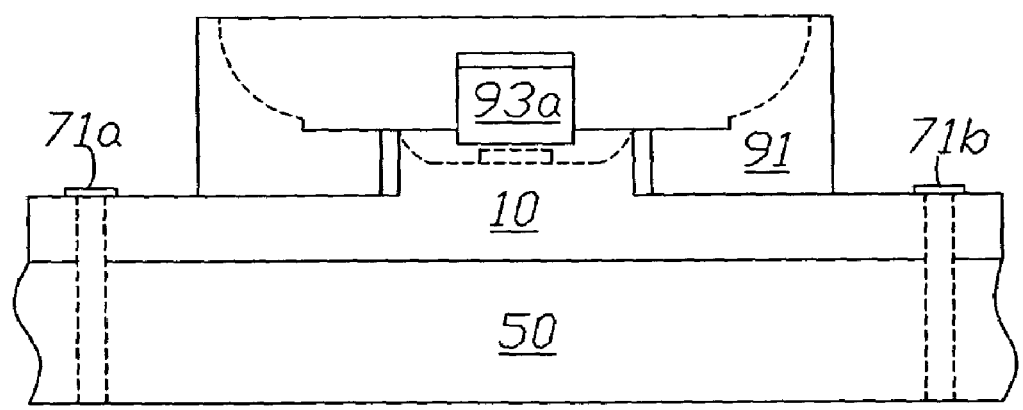
FIG. 9 is a schematic drawing of another embodiment of a SMD-type light emitting diode with high heat dissipation efficiency in accordance with the present invention.
Figure 7:
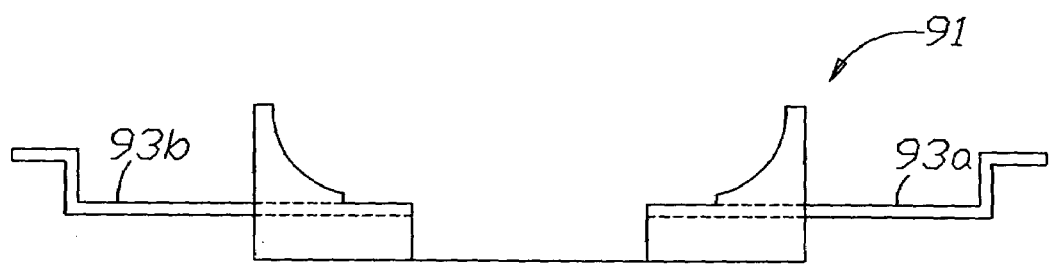
FIG. 7 is a schematic drawing of a metal leadframe encapsulated with plastic in accordance with the present invention.
Figure 8A:
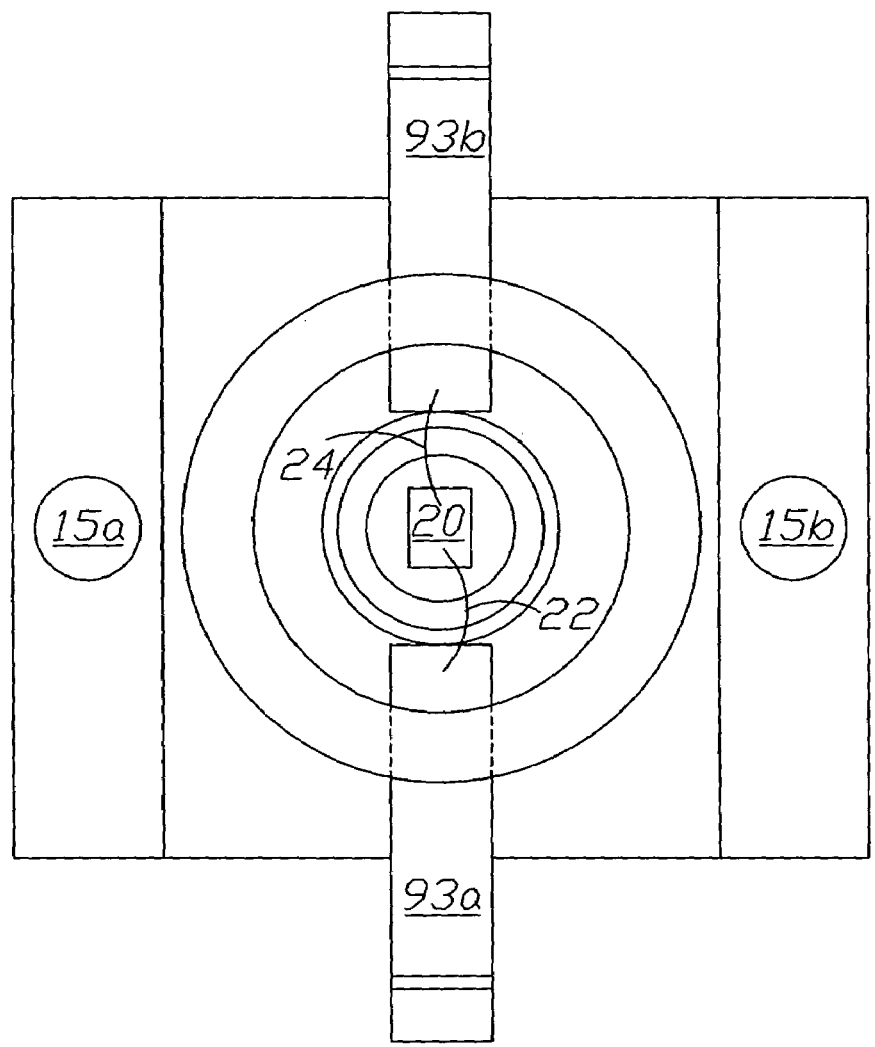
FIG. 8A is a top view of a metal leadframe encapsulated with plastic assembled with a base in accordance with the present invention.
Figure 8B:
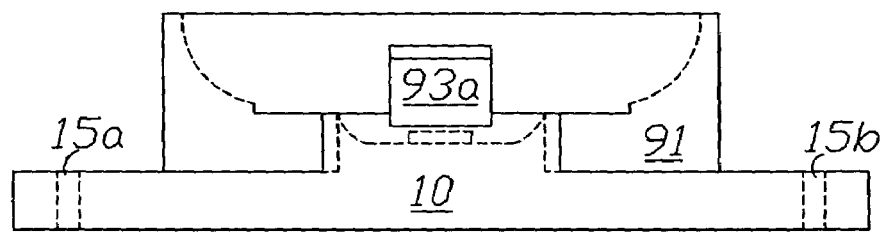
FIG. 8B is a schematic drawing of a metal leadframe encapsulated with plastic assembled with a base in accordance with the present invention.

Refer from FIG. 7 to FIG. 9, a better embodiment of a circuitry extension device in accordance with the present invention is disclosed. The circuitry extension device in this embodiment is a metal leadframe encapsulated with plastic 91. The plastic body thereof is hollow for accommodating the base while the metal leadframe includes two pins 93a, 93b for connection with the positive/negative electrodes of LED chip and the external circuitry. Furthermore, refer to FIG. 8A (top view) & FIG. 8B (lateral view), a better embodiment of the base assembling with the metal leadframe encapsulated with plastic in accordance with the present invention is disclosed. The base 10 is joined with the metal leadframe encapsulated with plastic 91 by heat resistant resin. The LED chip 20 is electrically connected with two pins (metal leadframe) 93a, 93b through the wire bonding 22, 24 while the positions of the metal leadframe 93a, 93b and the contact holes 15a, 15b of the base 10 are staggered. Epoxy resin and silicon rubber are filled between the LED chip 20 and the metal leadframe encapsulated with plastic 91 so as to protect the LED chip 20 and enhances the light-emitting effect.

Refer to FIG. 9, an assembling of a better embodiment is disclosed. The base 10 is connected with the metal leadframe encapsulated with plastic 91 by glue. Then fasteners 71a, 71b are used to connect the base 10 of the SMD-type LED with the external heat sink 50. As to the connection with the external circuitry (not shown in figure), it is through two pins 93a, 93b of the metal leadframe 91. The direction of electrical connection is different from that of the heat dissipation. And the heat and electricity are conducted through different components. Thus a better heat dissipation effect is achieved.

Figure 10:
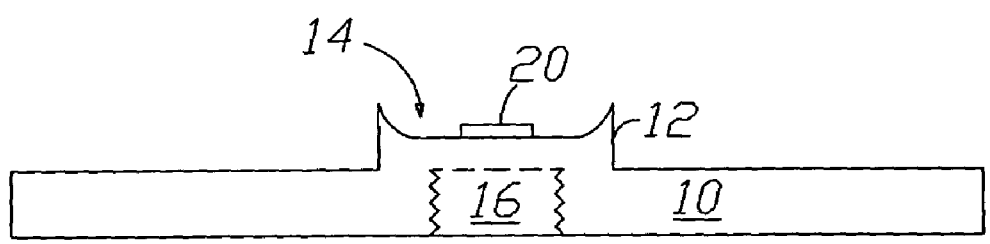
FIG. 10 is a schematic drawing of a base of another embodiment in accordance with the present invention.
Figure 11:
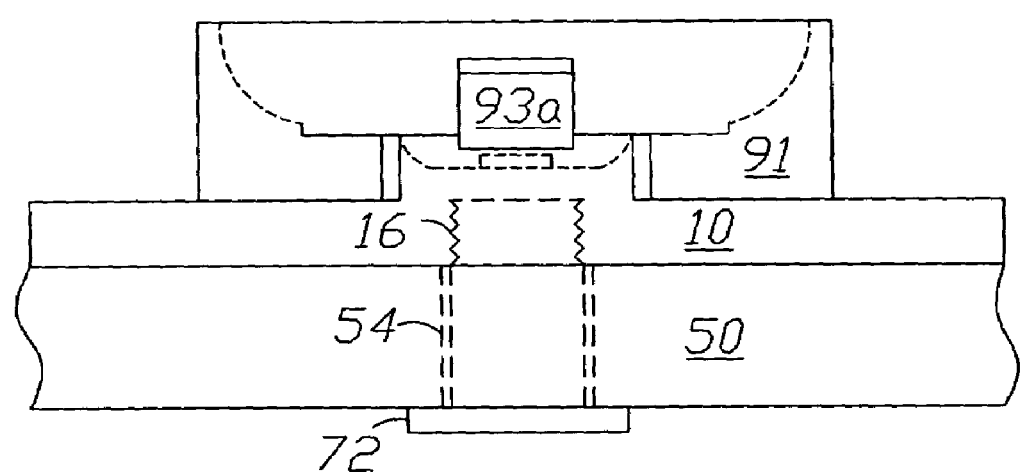
FIG. 11 is a schematic drawing of a further embodiment of a SMD-type light emitting diode with high heat dissipation efficiency in accordance with the present invention.

The contact holes 15a, 15b of the base 10 for connecting with the external heat sink are either penetrating holes as mentioned in above embodiment, or blinds holes with threads therein. Refer to FIG. 10, a further embodiment in accordance with the present invention is disclosed. The penetrating contact holes 15a, 15b on two sides of the base 10 are replaced by a blind hole with thread 16 on the bottom of the post 12. After connecting with the metal leadframe encapsulated with plastic 91, the base 10 is assembled with the external heat sink 50, a shown in FIG. 11. The external heat sink 50 includes a penetrating through hole 54, together with a fastening screw 72, for fastening the external heat sink 50 on the base 10. By tight connection between the fastening screw 72 and the thread of the blind hole 16, the external heat sink 50 attached on the base 10 firmly so as to achieve good heat dissipation.

The number of the LED chip is at least one or a plurality of chips is used at the same time, only if the number of the connecting pads and the wires on the circuitry extension device also increase.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An SMD-type light emitting diode with high efficiency of heat dissipation, comprising:
    a base including a post arranged and integrated at the center thereof, a slot formed on the top of the post; wherein at least one contact hole is disposed at the bottom of the base;
    at least one LED chip mounted in the slot of the base; and
    a circuitry extension device having a central hole, at least a first pair of positive and negative contacts, and at least a second pair of positive and negative contacts for connecting to an external circuit; the first pair of positive and negative contacts being positioned over an upper surface of the circuitry extension device for connecting with the positive and negative electrodes, respectively, of the LED chip; the circuitry extension device being disposed on the top of the base and being connected with the base by a heat resistant glue, wherein said post of said base extends through said central hole of said circuitry extension device;
    wherein the LED chip is electrically connected with the circuitry extension device by a wire selected from a group consisting of a gold wire and an aluminum wire, and further connected with the external circuit through an extension circuit on the upper surface of the circuitry extension device.

2. The device according to claim 1, wherein said at least one contact hole of the base is a penetrating through hole.

3. The device according to claim 1, wherein the base is connected with an external heat sink through the contact hole.

4. The device according to claim 1, wherein the circuitry extension device is a printed circuit board printed with said extension circuit.

5. The device according to claim 1, wherein the circuitry extension device is a metal leadframe encapsulated with plastic.

6. The device according to claim 1, wherein the base is made of high thermal conductive material selected from a group consisting of gold, silver, copper, aluminum, graphite, related alloy, and compounds.

7. An SMD-type light emitting diode with high efficiency of heat dissipation, comprising:
    a base including a post arranged and integrated at the center thereof, a slot formed on the top of the post; wherein at least one contact hole is disposed on the bottom of the base;
    at least one LED chip mounted in the slot of the base;
    a circuitry extension device having a central hole, at least a first pair of positive and negative contacts and at least a second pair of positive and negative contacts for connecting to an external circuit; the first pair of positive and negative contacts being positioned over an upper surface of the circuitry extension device for connecting with positive and negative electrodes, respectively, of the LED chip; the circuitry extension device being disposed on the top of the base and being connected with the base by a heat resistant glue;
    wherein the LED chip is electrically connected with the circuitry extension device by a wire, and further connected with the external circuit through an extension circuit on the upper surface of the circuitry extension device; and
    wherein the contact hole of the base is a blind hole with thread.

8. An SMD-type light emitting diode with high efficiency of heat dissipation, comprising:
- a base having a post arranged and integrated at the center thereof, a slot formed on the top of the post; wherein at least one contact hole is disposed on the bottom of the base;
- at least one LED chip mounted in the slot of the base; and
- a hollow metal leadframe encapsulated with plastic having at least a pair of positive and negative contacts, and pins extended on two sides thereof; the metal leadframe encapsulated with plastic being disposed on the top of the base and being connected with the base by a heat resistant glue;
- wherein the LED chip is electrically connected with the positive and negative contacts of the metal leadframe encapsulated with plastic by a wire selected from a group consisting of a gold wire and an aluminum wire, and further connected with an external circuit through the pins of the metal leadframe encapsulated with plastic.

9. An SMD-type light emitting diode with high efficiency of heat dissipation comprising
- a base with a post arranged and integrated on the center thereof, a slot on top of the post; a blind hole with thread is disposed on the bottom of the post of the base;
- at least one LED chip mounted in the slot of the base;
- a hollow metal leadframe encapsulated with plastic having at least a pair of positive and negative contacts, and pins extended on two sides thereof; the metal leadframe encapsulated with plastic is on top of the base and is connected with the base by heat resistant glue;
- wherein the LED chip is electrically connected with the positive and negative contacts of the metal leadframe encapsulated with plastic by gold wire or aluminum wire, and then further connected with external circuit through the pins of the metal leadframe encapsulated with plastic.

* * * * *